(12) United States Patent
Joung

(10) Patent No.: US 8,927,304 B2
(45) Date of Patent: Jan. 6, 2015

(54) LED PACKAGE AND METHOD OF MANUFACTURING THE SAME

(75) Inventor: Il Kweon Joung, Gyunggi-do (KR)

(73) Assignee: Samsung Electronics Co., Ltd., Suwon-Si, Seoul (KR)

( * ) Notice: Subject to any disclaimer, the term of this patent is extended or adjusted under 35 U.S.C. 154(b) by 492 days.

(21) Appl. No.: 13/345,437

(22) Filed: Jan. 6, 2012

(65) Prior Publication Data

US 2012/0107976 A1 May 3, 2012

Related U.S. Application Data

(62) Division of application No. 12/236,086, filed on Sep. 23, 2008, now abandoned.

(30) Foreign Application Priority Data

Mar. 17, 2008 (KR) .................. 10-2008-0024329

(51) Int. Cl.
*H01L 21/00* (2006.01)
*H01L 33/48* (2010.01)
*H01L 33/60* (2010.01)

(52) U.S. Cl.
CPC .............. *H01L 33/486* (2013.01); *H01L 33/60* (2013.01); *H01L 2224/48091* (2013.01)
USPC .................... 438/27; 257/100; 257/E33.059

(58) Field of Classification Search
USPC .................. 438/27; 257/98–100, E33.059
See application file for complete search history.

(56) References Cited

U.S. PATENT DOCUMENTS

| 7,045,905 B2 | 5/2006 | Nakashima |
| 2004/0173810 A1 | 9/2004 | Lin et al. |
| 2007/0090382 A1 | 4/2007 | Ryu |
| 2007/0228947 A1 * | 10/2007 | Tanimoto et al. ............. 313/506 |

FOREIGN PATENT DOCUMENTS

| JP | 10-215002 | 8/1998 |
| JP | 2002-223002 | 9/2002 |
| KR | 10-2005-0036693 A | 4/2005 |

OTHER PUBLICATIONS

Korean Office Action issued in Korean Patent Application No. 10-2008-0024329, mailed Nov. 27, 2009.

* cited by examiner

*Primary Examiner* — David Vu
(74) *Attorney, Agent, or Firm* — McDermott Will & Emery LLP

(57) ABSTRACT

The present invention relates to light emitting diode (LED) packages and methods of manufacturing the same, and more particularly, to an LED package and a method of manufacturing the same that can reduce a variation of color coordinates of mass-produced LED packages.

4 Claims, 5 Drawing Sheets

LED PACKAGE AND METHOD OF MANUFACTURING THE SAME

CROSS-REFERENCE TO RELATED APPLICATIONS

This application is a Divisional of U.S. application Ser. No. 12/236,086, filed on Sep. 23, 2008 now abandoned, which claims the priority of Korean Patent Application No. 2008-0024329 filed on Mar. 17, 2008, in the Korean Intellectual Property Office, the disclosures of which are incorporated herein by reference.

BACKGROUND OF THE INVENTION

1. Field of the Invention

The present invention relates to light emitting diode (LED) packages and methods of manufacturing the same, and more particularly, to an LED package and a method of manufacturing the same that can reduce a variation of color coordinates of mass-produced LED packages.

2. Description of the Related Art

In general, light emitting diode (hereinafter, simply referred to as an "LED") packages that include LEDs to generate light emission according to electrical signals are widely used in a wide variety of electronic products including mobile communication terminals, such as personal cellular phones, and PDAs.

A lead frame is used, a filler, obtained by mixing phosphors and silicon, is injected into a bucket of the lead frame, and the inserted filler is cured at a high temperature, such that the LED package is manufactured.

FIGS. 1 and 2 are views illustrating an LED package according to the related art. FIG. 1 is a view illustrating a method of manufacturing an LED package according to the related art. FIG. 2 is a cross-sectional view illustrating the LED package after a filler is injected into a bucket of the LED package, shown in FIG. 1, and then cured.

As shown in FIGS. 1 and 2, according to the related art, the LED package 1 includes an LED chip L. The LED chip L is mounted within an area formed by a first partition wall 2, a second partition wall 3, a third partition wall 4, and a fourth partition wall by die bonding and wire bonding. A filler obtained by mixing phosphors and silicon fills in the area by using a dispenser D.

That is, when a plurality of LED packages are manufactured, LED chips L are individually mounted within respective buckets B, and the exact amount of filler 6 is then injected into each of the buckets having the LED chips therein.

However, when the LED package 1 is manufactured by using the above method, the filler 6 varies in height as shown in FIG. 2.

Further, it is also difficult for the dispenser D to fill each of the plurality of buckets B with the exact same amount of filler (since the bucket B is filled with a very small amount of filler). Furthermore, as shown in FIG. 1, since the third partition wall 4 and the fourth partition wall 5 of the bucket B are relatively thinner than the first partition wall 2 and the second partition wall 3, the third partition wall 3 and the fourth partition wall 5 are slightly deformed when curing the filler at a high temperature. As a result, as shown in FIG. 2, the filler varies in height, that is, a height a, b, or c.

Therefore, when an LED package is manufactured in mass production, the filler filling in each of the LED packages has a height varying according to each of the LED packages. As a result, when the LED packages generate a light emission, they have different refractive indexes.

Even when LED packages emit light of the same color, color coordinates become slightly different from each other, which results in an increase in the variation of the color coordinates.

Further, since lead frames need to be designed and manufactured according to the varying thickness of the LED packages, manufacturing costs increase.

SUMMARY OF THE INVENTION

An aspect of the present invention provides an LED package and a method of manufacturing the same that can reduce a variation of color coordinates of mass-produced LED packages, and manufacture LED packages of varying thickness by using one lead frame.

According to an aspect of the present invention, there is provided an LED package including: a base part having a mounting portion to which an LED chip is bonded, and partition wall portions arranged at both sides facing each other of the mounting portion, the mounting portion having the other set of opposite sides opened; a filling part filling in a space formed by the mounting portion and the partition walls at both opposite sides and transmitting light generated from the LED chip; and an electrode part molded in the base part, protruding outward, and connected to the LED chip.

The partition walls may include a reflective film to reflect light generated from the LED chip.

The base part may be a single body.

The base part may be provided by dicing a base at predetermined intervals, the base including partition walls formed at both opposite sides, and a groove formed between the partition walls and having a plurality of LED chips bonded thereto.

The filling part may be provided by dicing a filler filling in a space formed by the partition walls and the groove of the base, and be exposed through the other set of opposite sides of the mounting portion.

According to another aspect of the present invention, there is provided a method of manufacturing an LED package, the method including: providing a base having partition walls formed at both opposite sides thereof and a groove arranged between the partition walls and having both open ended portions; arranging a plurality of LED chips at predetermined intervals and bonding the LED chips to the groove; filling a space formed by the partition walls and the groove with a filler and curing the filler; and dicing the base filled with the filler at predetermined intervals.

The filling a space with a filler may include providing screen members at both open ended portions of the base, and filling a space formed by the partition walls, the groove, and the screen members.

The method may further include removing the screen members before or after the dicing the base.

In the bonding the LED chips to the groove, the LED chips may be arranged at irregular intervals according to the thickness of required LED packages, and in the dicing the base, the base may be diced to separate the LED chips having thickness varying according to the thickness of the required LED packages.

The providing a base may further include forming a reflective film on the partition walls to reflect light generated from the LED chips.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

An LED package and a method of manufacturing the same according to exemplary embodiments of the present invention will now be described in detail with reference to the accompanying drawings.

Figure 1:
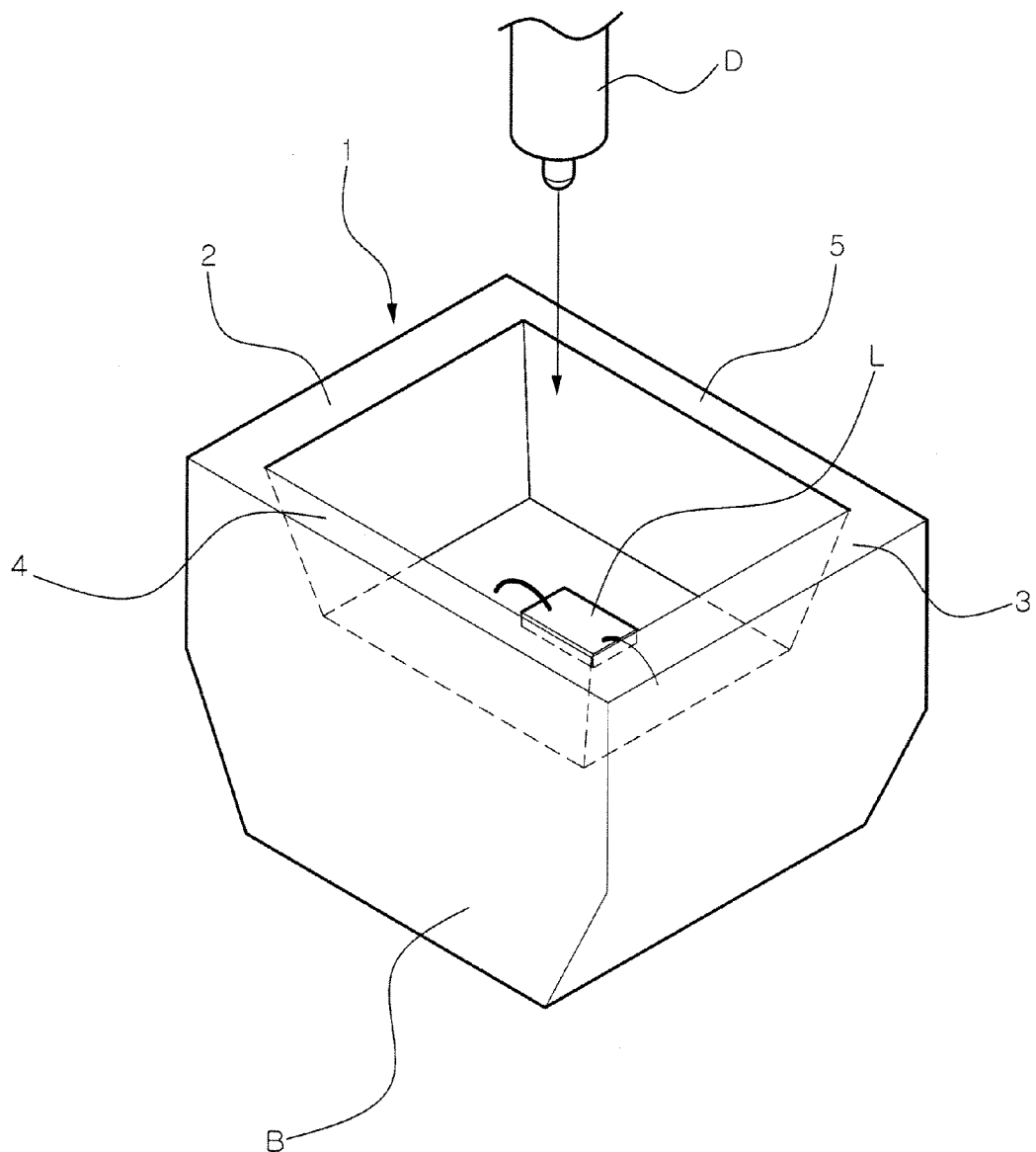
FIG. 1 is a view illustrating a method of manufacturing an LED package according to the related art.
Figure 2:
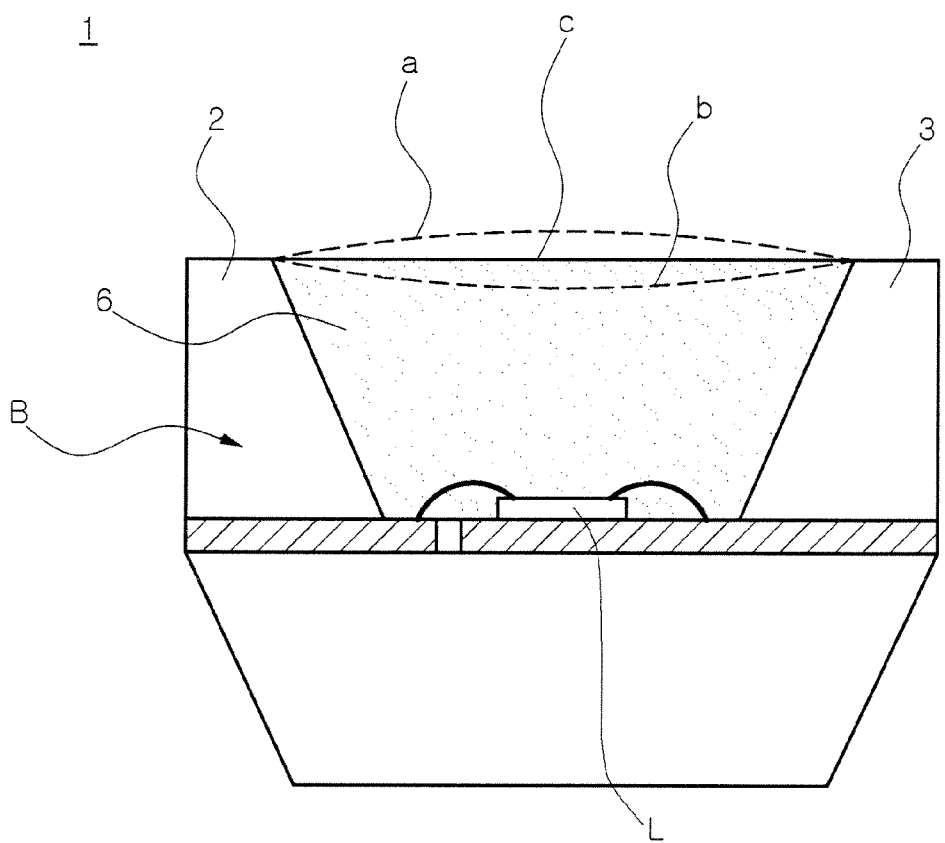
FIG. 2 is a side cross-sectional view illustrating the LED package manufactured by the method of FIG. 1.
Figure 3:
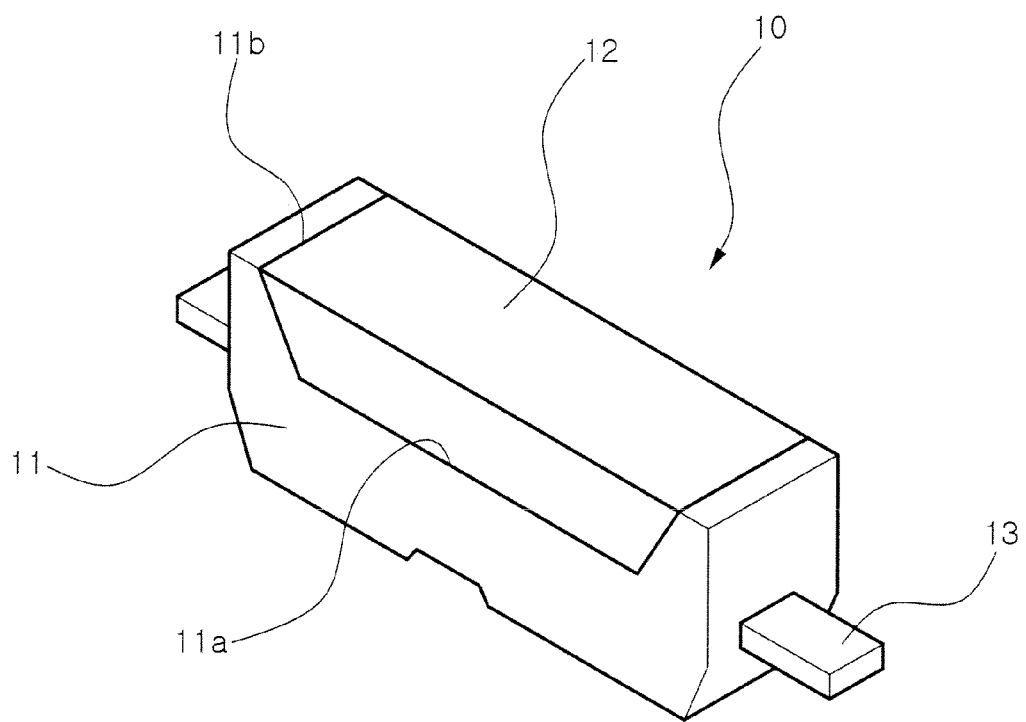
FIG. 3 is a perspective view illustrating an LED package according to an exemplary embodiment of the invention.

First, an LED package according to an exemplary embodiment of the invention will be described with reference to FIG. 3. FIG. 3 is a perspective view illustrating the LED package according to the embodiment of the invention.

As shown in FIG. 3, an LED package 10 according to an exemplary embodiment of the invention includes a base part 11, a filling part 12, and an electrode part 13.

Partition wall portions 11b are formed at both sides of the base part 11, and a mounting portion 11a is provided between the partition wall portions 11b.

An LED chip (not shown) is connected to the mounting portion 11a by bonding (including at least one of die bonding and wire bonding). As the filling part 12 fills in the mounting portion 11a, the LED chip is buried in the filling part 12. The LED chip (not shown) is electrically connected to the electrode part 13.

As described above, the base part 11 of the LED package according to this embodiment includes the partition wall portions 11b at both sides facing each other of the mounting portion 11a. At the same time, the other set of opposite sides are opened.

The electrode part 13 is blocked by the partition wall portions 11b, but at the same time, both sides of the electrode part 13 are exposed to the outside.

Preferably, a reflective film is formed on the partition wall portions 11b in order to reflect light generated from the LED chip.

A package body is manufactured, and then the LED package 10 is manufactured by dicing the package body. A method of manufacturing the LED package 10 will be described in detail with reference to FIGS. 4 and 5.

Figure 4:
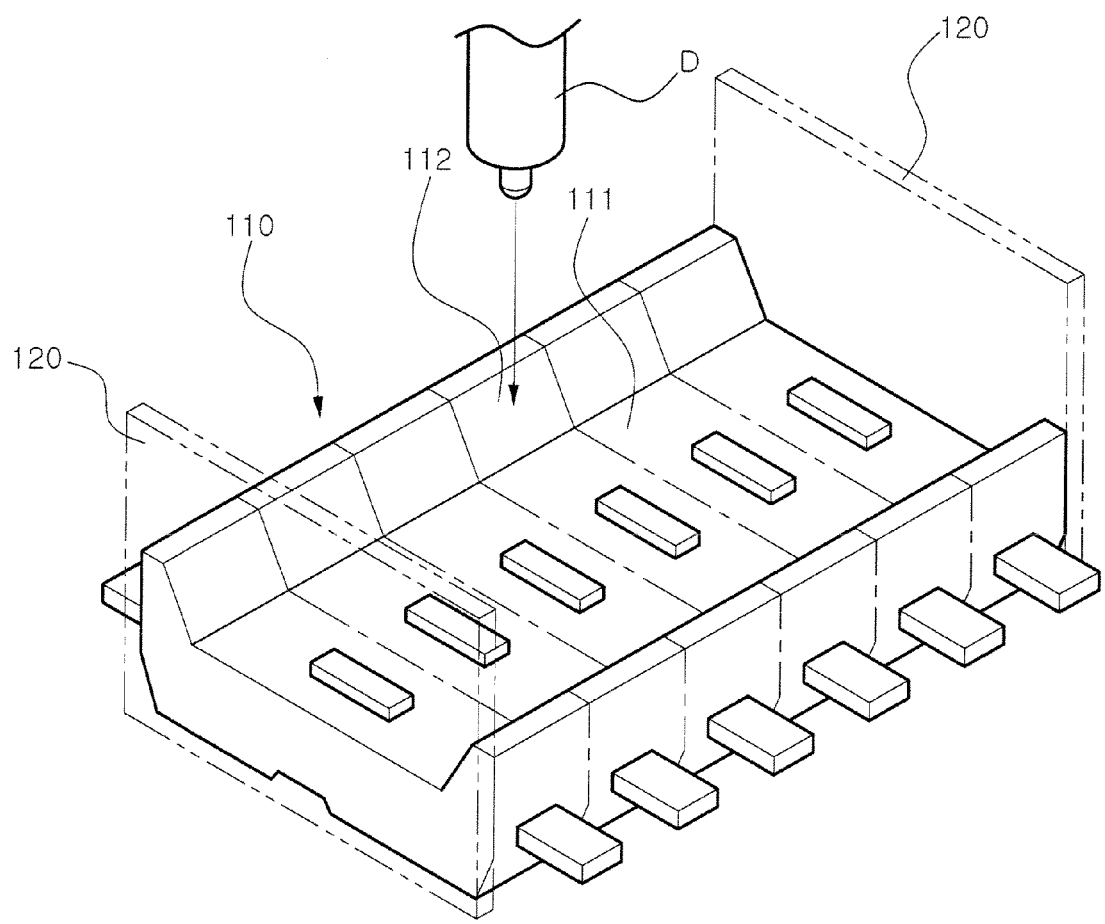
FIG. 4 is a view illustrating a method of manufacturing a package body according to another exemplary embodiment of the invention.
Figure 5:
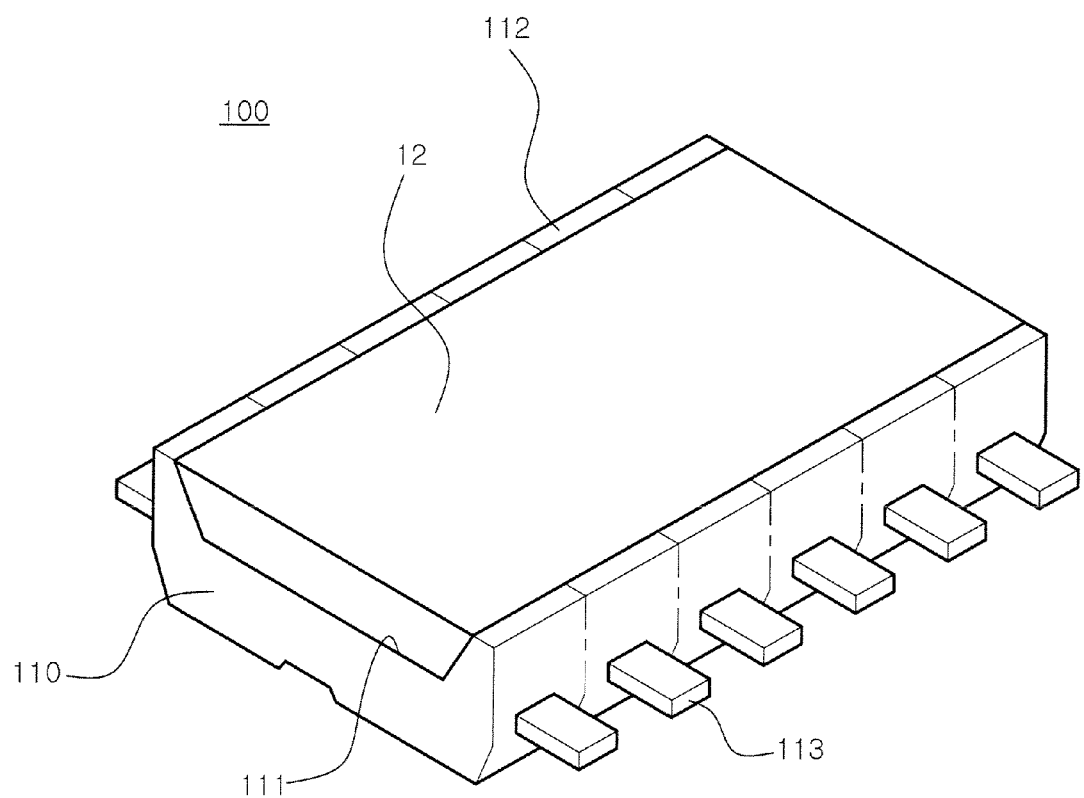
FIG. 5 is a view illustrating a package body manufactured by the method of FIG. 4.

FIG. 4 is a view illustrating a process of manufacturing a package body that is used to manufacture an LED package according to another exemplary embodiment of the invention. FIG. 5 is a view illustrating the package body that is manufactured by the manufacturing method according to the embodiment of the invention, shown in FIG. 4.

First, a process of manufacturing a package body 100 that is used to manufacture the LED package according to the embodiment of the invention, as shown in FIG. 5, will be described with reference to FIG. 4.

As shown in FIG. 4, a base 110 with large length is provided. Partition walls 112 are provided at a predetermined height on both sides of the base 110. A groove 111 is provided between the partition walls 112 along a longitudinal direction, and has a predetermined width. Both end portions of the groove 111 are opened.

Preferably, the base 110 is formed of resin by injection molding to thereby form a single body together with the partition walls 112 and the groove 111. Preferably, a reflective film 121 is also formed on the partition walls 112 so as to reflect light generated by the emission of LED chips.

A plurality of LED chips are arranged at predetermined intervals, and bonded to the groove 111.

Screen members 120 are located at both opened ends of the groove 111. The screen members 120 may have substantially the same height as the partition walls 112. Alternatively, as shown in FIG. 4, the screen members 120 may have a greater height than the partition walls 112.

Here, a predetermined space that is formed by the groove 111, the partition walls 112, and the screen member 120 is filled with a predetermined filler by using a dispenser D.

This filler is a liquid mixture of phosphors, silicon, and the like to transmit light that is generated from the LED chips.

The partition walls 112 are plated or coated with the reflective film 121 or applied with a reflective material. Further, the partition walls 112 are inclined at a predetermined angle. Accordingly, the partition walls 112 can reflect light generated by the LED chips to emit the light to the outside.

Then, the filler fills in the base 110, shown in FIG. 4, and is cured at a high temperature, thereby manufacturing the package body 100 as shown in FIG. 5. After the curing process is completed, the screen members 120 (reference numeral 120, refer to FIG. 4) are preferably removed.

The package body 100, shown in FIG. 5, is diced at predetermined intervals. The diced package body 100 is subjected to a trimming process, a forming process, and the like to thereby form a plurality of LED packages as shown in FIG. 3.

That is, when the package body 100 is diced, the base 110, shown in FIG. 5, is diced into portions serving as the base part 11, shown in FIG. 3, the partition walls 112, shown in FIG. 5, are diced into portions serving as the partition wall portions 11b, shown in FIG. 3, and the groove 111 is diced into portions serving as the mounting portion 11a, shown in FIG. 3.

The package body 100 is diced according to the thickness of each LED package along imaginary lines, shown in FIG. 5. Here, the imaginary lines indicate intervals at which the package body 100 is diced.

Here, the package body 100 is not necessarily diced at regular intervals. However, the LED chips are previously arranged according to required thickness of LED packages, and the LED packages having the LED chips therein undergo the filling and curing processes. Then, the package body is diced according to the thickness of each of the LED packages. Therefore, a plurality of LED packages having different thicknesses can be manufactured.

When the method according to the related art is used, the filler needs to be equally dispensed to each of the LED packages. On the other hand, when the LED packages are manufactured by the above-described method according to the embodiment of the invention, the filler uniformly fills in the groove of the one base, and then the package body is diced. A plurality of LED packages that are manufactured using one base have the same filling height of the filler.

Further, in the method of manufacturing an LED package according to the related art, individual LED packages are separately cured, and thus the manufactured products may have slightly different characteristics since the LED packages may have different thermal strains. On the other hand, when an LED package is manufactured by the method according to the embodiment of the invention, the filler uniformly fills in the entire base, and then the entire base filled with the filler is cured. LED packages having substantially uniform characteristics can be manufactured this way.

Further, according to the method of manufacturing an LED package according to the embodiment of the invention, the partition walls 112 are formed at both opposite sides, and at the same time, the other set of opposite sides are opened. Therefore, when the volume required to be filled with the filler needs to be constant, the thickness of the partition walls can be more increased instead of the opened portions. As a result, thermal deformation occurring when a curing process is performed at a high temperature can be effectively prevented.

As set forth above, according to the exemplary embodiments of the invention, when LED packages are manufactured in mass production, the height of the filler filling in the LED packages can be uniform to thereby reduce a variation in color coordinates of the manufactured LED packages. As a result, LED packages of varying thickness can be manufactured by using one base.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing an LED package, the method comprising:
   providing a base having partition walls formed at both opposite sides thereof and a groove arranged between the partition walls and having both open ended portions;
   arranging a plurality of LED chips at predetermined intervals and bonding the LED chips to the groove;
   filling a space formed by the partition walls and the groove with a filler and curing the filler; and
   dicing the base filled with the filler at predetermined intervals;
   wherein the filling a space with a filler comprises providing screen members only at both open ended portions of the base, and filling a space formed by the partition walls, the groove, and the screen members;
   further comprising removing the screen members before or after the dicing the base.

2. The method of claim 1, wherein in the bonding the LED chips to the groove, the LED chips are arranged at irregular intervals according to the thickness of required LED packages, and
   in the dicing the base, the base is diced to separate the LED chips having thickness varying according to the thickness of the required LED packages.

3. The method of claim 1, wherein the providing a base further comprises forming a reflective film on the partition walls to reflect light generated from the LED chips.

4. A method of manufacturing an LED package, the method comprising:
   within a base having partition walls formed at both opposite sides thereof and a groove arranged between the partition walls and having both open ended portions, arranging a plurality of LED chips at predetermined intervals and bonding the LED chips to the groove;
   positioning screen members only at both open ended portions of the base;
   filling a space formed by the partition walls, the groove, and the screen members, and curing the filler;
   dicing the base filled with the filler at predetermined intervals; and
   removing the screen members before or after the dicing the base.

* * * * *